(12) United States Patent
Miyajima et al.

(10) Patent No.: US 6,504,269 B1
(45) Date of Patent: Jan. 7, 2003

(54) INPUT DEVICE AND ELECTRONIC APPLIANCE USING THE SAME

(75) Inventors: Akio Miyajima, Osaka; Tamotsu Yamamoto, Hyogo; Tsutomu Sakuma; Akira Nakanishi, both of Osaka; Toyoshi Fukumura, Kyoto, all of (JP)

(73) Assignee: Matsushita Electrical Industrial Co., Ltd., Osaka (JP)

( * ) Notice: Subject to any disclaimer, the term of this patent is extended or adjusted under 35 U.S.C. 154(b) by 0 days.

(21) Appl. No.: 09/450,306

(22) Filed: Nov. 29, 1999

(30) Foreign Application Priority Data

Nov. 27, 1998 (JP) .......................................... 10-337181

(51) Int. Cl.⁷ ................................................. H02B 1/24
(52) U.S. Cl. ......................... 307/131; 307/112; 307/116
(58) Field of Search ................................ 307/131, 112, 307/116; 361/42; 324/725, 681; 340/870.37; 178/20.01

(56) References Cited

U.S. PATENT DOCUMENTS

| | | | | |
|---|---|---|---|---|
| 3,862,432 A | * | 1/1975 | Larson | 307/116 |
| 3,992,634 A | * | 11/1976 | Larson | 307/116 |
| 4,177,421 A | * | 12/1979 | Thornberg | 324/61 R |
| 5,869,791 A | * | 2/1999 | Young | 178/20.01 |
| 6,111,732 A | * | 8/2000 | Beland | 361/42 |

* cited by examiner

Primary Examiner—Brian Sircus
Assistant Examiner—Robert L. Deberadinis
(74) Attorney, Agent, or Firm—RatnerPrestia

(57) ABSTRACT

A touch type input device is used for various forms of control. A primary side line is connected to a power source, and a secondary side circuit ground through a power transformer are connected by an impedance element. Flat electrodes to be touched by a finger are formed on one side of an insulating base material, and are connected to a ground current detection circuit through a high resistor and a low pass filter. A control circuit for converting the output of the ground current detection circuit into a control signal for an electronic appliance, and a display unit are provided. Therefore, an input device having plural touch switches disposed on a base material in a free shape and layout can be obtained.

24 Claims, 17 Drawing Sheets

70 74 72 73 71

75

83 84 82 86
87
12
12

INPUT DEVICE AND ELECTRONIC APPLIANCE USING THE SAME

FIELD OF THE INVENTION

The present invention relates to a touch type input device used in control of electronic appliance or the like, and an electronic appliance using the same.

BACKGROUND OF THE INVENTION

A conventional example of capacitance type touch switch as an input device is described below while referring to a structural diagram in FIG. 16.

A capacitance type touch switch 11 as an example of capacitance type touch switch shown in FIG. 16 comprises:

a. a planar dielectric 1 made of glass or the like as base material, b. a first conductive film 2 disposed at one side of the dielectric 1 as a flat electrode relatively wide in area so as to be touched by finger, c. a second conductive film 3 and a third conductive film 4 disposed parallel at both sides of the dielectric 1 so as to face the first conductive film 2 on the dielectric 1 as two flat electrodes of small area, d. a signal source 8 of pulse signal, alternating-current signal or the like connected between the second conductive film 3 and the ground 7, e. an amplifier 9 connected to the third conductive film 4 for detecting and amplifying potential fluctuations of the third conductive film 4, and f. a controller 10 for converting the output of the amplifier 9 into a control signal for controlling an electronic appliance (not shown).

In this constitution, the first conductive film 2 and second conductive film 3 disposed at both sides of the dielectric 1 compose a capacitance 5, and the first conductive film 2 and third conductive film 4 compose a capacitance 6.

A first conductive film 13, a second conductive film 14, and third conductive film 15 of a capacitance type touch switch 12 are provided on the same dielectric 1 as used in the aforesaid capacitance type touch switch 11. The individual conductive films of these two capacitance type touch switches 11, 12 are formed at a specific distance.

The operation of thus constituted capacitance type touch switch 11 is explained below. While the user is not touching the first conductive film 2 by finger, the signal from the signal source 8 is fed into the amplifier 9 through a series circuit of two capacitances 5 and 6. When the first conductive film 2 is touched by finger, as shown in a conceptual circuit diagram in FIG. 17, a capacitance 16 generated between the human body and the ground 7 is connected between the junction of the two capacitances 5, 6 and the ground 7. As compared with the level while the first conductive film 2 is not touched by the user's finger, the output impedance of the signal source 8 side as seen from the amplifier 9 side is lowered, and the signal level entering the amplifier 9 is lowered.

The amplifier 9 amplifies and issues such change of signal level. The controller 10 converts the output of the amplifier 9 into a control signal for controlling the electronic appliance.

When the user touches the first conductive film 13 of the other capacitance type touch switch 12 by finger, the operation is the same as mentioned above.

However, in the capacitance type touch switch as the conventional input device, as explained above, two capacitance type touch switches 11, 12 are provided on the same dielectric 1. When the capacitance type touch switches 11 and 12 are disposed closely to each other, the capacitance 17 generated between the first conductive film 2 of the capacitance type touch switch 11 and the second conductive film 14 of the capacitance type touch switch 12 may have effects on the operation of the two capacitance type touch switches 11 and 12. Such effects on operation may lead to malfunction. To prevent this malfunction, it is hard to dispose the two capacitance type touch switches 11 and 12 closely to each other.

SUMMARY OF THE INVENTION

An input device is capable of installing the electrodes of plural touch switches on a base material in a free shape and layout.

The input device comprises:

a power transformer connected to a commercial power source, a ground current detection circuit connected to the secondary side circuit of this power transformer and insulated from the ground, an impedance element connected between this ground current detection circuit and the primary side circuit of the power transformer, an operation unit having one or plural flat electrodes disposed at least on the top of a base material made of insulating material connected to the ground current detection circuit, a control circuit connected to the ground current detection circuit, and a display unit showing the display corresponding to the flat electrode of the operation unit.

In the thus constituted input device, touch of finger can be detected by the flat electrode disposed only at one side of the base material, and moreover plural flat electrodes can be disposed on the base material in a free shape and layout, and if plural flat electrodes are disposed closely to each other, there is no mutual effect, and an inexpensive input device is obtained.

DETAILED DESCRIPTION OF THE EXEMPLARY EMBODIMENTS

Figure 1:
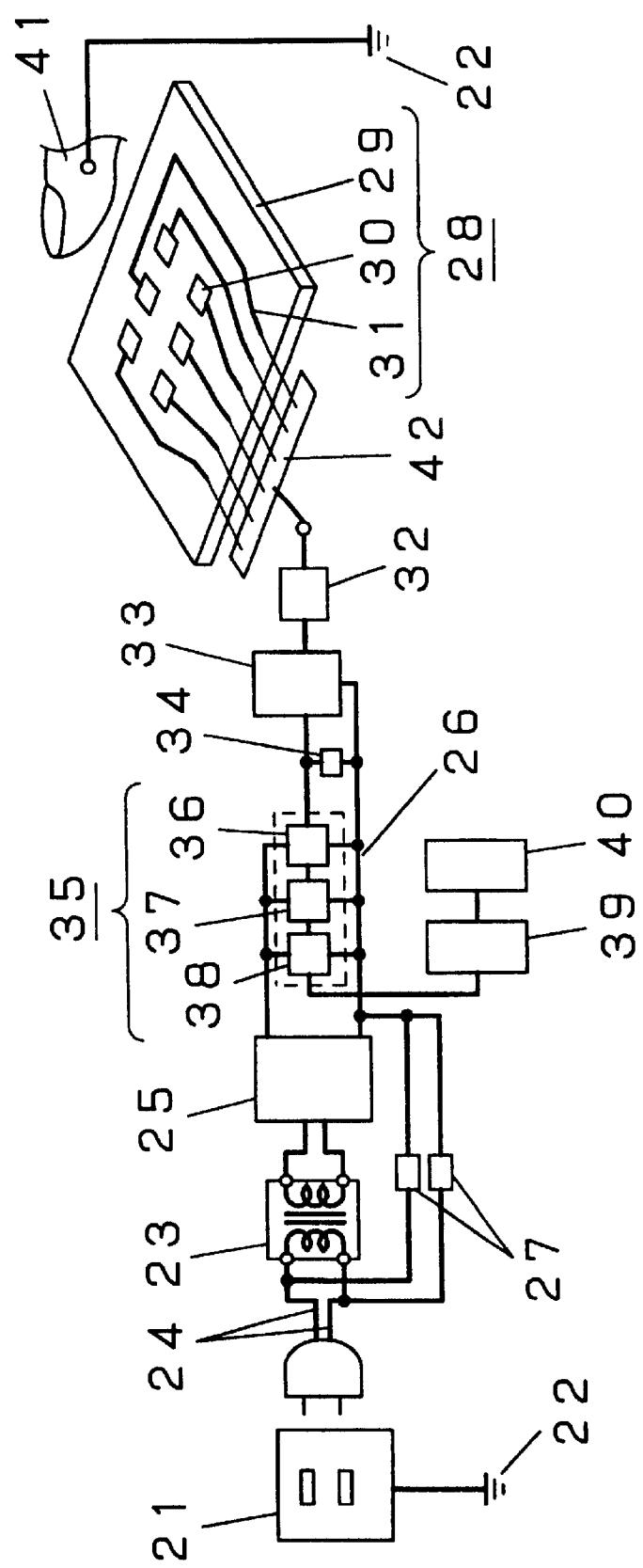
FIG. 1 is a structural diagram of an input device in a first exemplary embodiment of the invention.

Referring now to the drawings, exemplary embodiments of the invention are described below.

Embodiment 1

As shown in FIG. 1, one side of a commercial power source line 21 is connected to the ground 22. A power transformer 23 is connected to the commercial power source line 21 through its primary side line 24, and supplies an alternating-current power to the secondary side. A secondary side power source circuit 25 converts the secondary side alternating-current power of the power transformer 23 into a direct-current power. A secondary side circuit ground 26 of the entire secondary side circuit is connected to the secondary side power source circuit 25. Two impedance elements 27 such as capacitors are connected between both poles of the primary side line 24 and secondary side circuit ground 26.

The secondary side power source circuit 25 supplies electric power to a ground current detection circuit 35, a control circuit 39, and a display unit 40. The ground current detection circuit 35 is composed of a current sensor 36, an integrating circuit 37, and a discrimination circuit 38. The integrating circuit 37 is connected in series to the output side of the current sensor 36. The discrimination circuit 38 is connected in series to the output side of the integrating circuit 37. The control circuit 39 is connected to the discrimination circuit 38 at the output side of the ground current detection circuit 35. The display unit 40 is connected to the output side of the control circuit 39.

A low pass filter 33 is connected in series to the input side of the current sensor 36 of the ground current detection circuit 35. A constant voltage element 34 such as zener diode is similarly connected parallel to the input side of the current sensor 36. A high resistor 32 of about 1 M ohm is connected in series to the input side of the low pass filter 33. The operation unit 28 connected electrically to the input side of the high resistor 32 is the portion for feeding signal by touching the user's finger.

Figure 2:
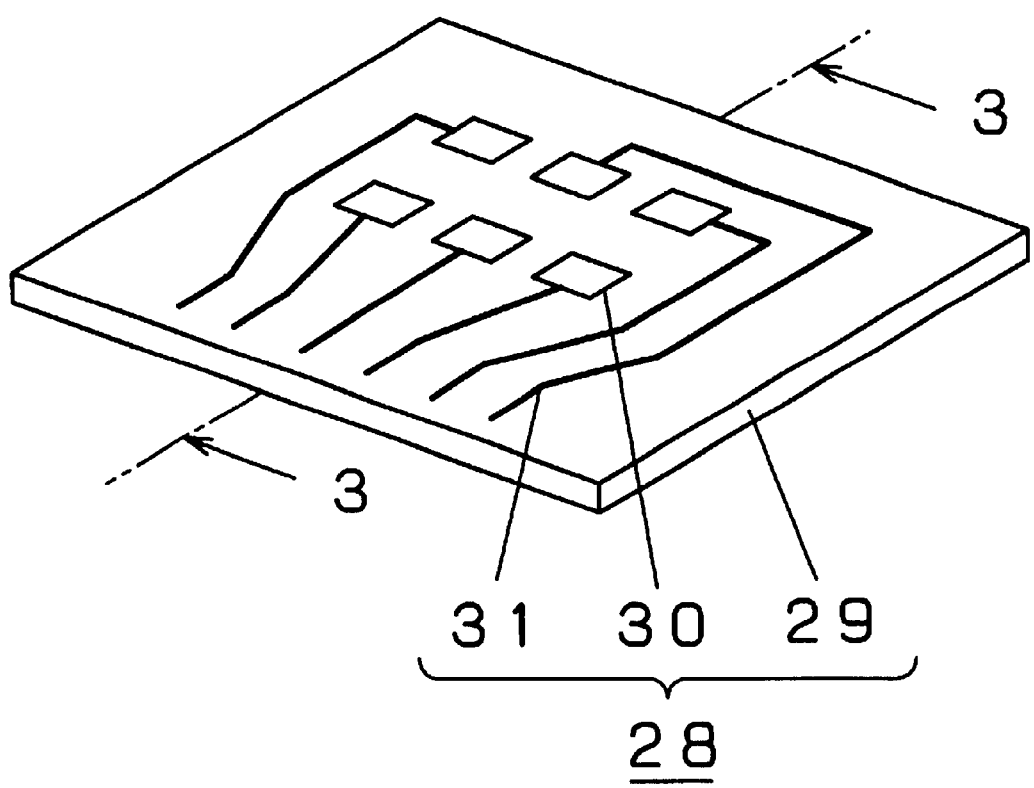
FIG. 2 is a perspective view of operation unit in a first exemplary embodiment of the invention.
Figure 3:
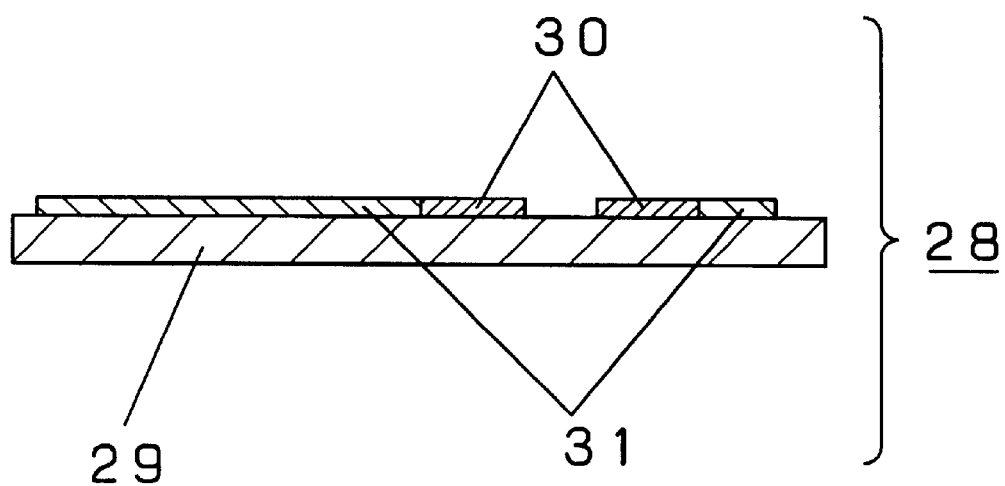
FIG. 3 is a sectional view along line 3—3 in FIG. 2.

This operation unit 28 comprises:

a transparent base material 29 made of polycarbonate or the like as shown in FIG. 2 and FIG. 3, a singularity or a plurality of flat electrodes 30 made of transparent conductive film of indium tin oxide (ITO) provided on specified positions on the top of the base material 29, and a transparent fine wiring line 31 made of ITO disposed on the top of the base material 29 having one end connected to the flat electrode 30.

The other end of the wiring line 31 is connected to the input side of the high resistor 32 through connecting means 42 such as connector.

In thus constituted input device, operation of each part is described below.

First, when the user being grounded with a certain grounding resistance touches the flat electrode 30 by finger 41, on the basis of the electric power supplied by the commercial power source line 21, the ground current flows in the route from the ground 22 to the commercial power source line 21 through the user's finger 41, flat electrode 30, wiring line 31, high resistor 32, low pass filter 33, current sensor 36, secondary side circuit ground 26, impedance element 27 and primary side line 24, or in a completely reverse route.

When such ground current flows, the operation of the ground current detection circuit 35 is as follows.

1. The current sensor 36 detects presence or absence or magnitude of this ground current,
2. The integrating circuit 37 integrates the output of the current sensor 36, and issues a signal at a level corresponding to the magnitude of the ground current by compensating for the intermittence caused because the ground current is an alternating current,
3. The discrimination circuit 38 discriminates the signal level from the integrating circuit 37 by a specified threshold value, and
4. The discrimination circuit 38 issues a qualitative signal "1" telling that the ground current is flowing when the signal level is above the threshold value, that is, the user's finger 41 is touching the flat electrode 30, to the control circuit 39.

To the contrary, when the user's finger 41 is released from the flat electrode 30, the route of the ground current is cut off, and the ground current does not flow.

At this time, the operation is as follows.

1. The current sensor 36 does not detect the ground current,
2. The discrimination circuit 38 confirms that the signal level from the integrating circuit 37 is below the specified threshold value, and
3. The discrimination circuit 38 issues a qualitative signal "0" telling that the ground current is not flowing, that is, the user's finger 41 is not touching the flat electrode 30, to the control circuit 39.

The control circuit 39, depending on the qualitative signal "1" or "0" entered from the discrimination circuit 38, controls the display content of the display unit 40 or issues a control signal for controlling the operation of the electronic appliance.

At this time, the discrimination circuit 38 of ground current detection circuit 35 issues a binary signal showing whether or not touching the flat electrode 30. This binary signal can be directly connected to the input unit of the digital circuit such as microcomputer included in the control circuit 39. The binary signal is characterized by allowing a noise margin against the noise induced on the wiring connecting between the ground current detection circuit 35 and control circuit 39.

Same effects are obtained by replacing the integrating circuit 37 and discrimination circuit 38 with a retriggerable-multivibrator.

The high resistor 32 limits the magnitude of the ground current so that electric shock may not be felt by the user's finger 41. The low pass filter 33 attenuates the electric noise such as high frequency component of radio broadcast or the like induced by the wiring line 31 or others. By attenuating the electric noise, malfunction of the ground current detection circuit 35 is suppressed. The constant voltage element 34 protects from breakdown or deterioration of the current sensor 36 by clamping voltages too high or too low for the current sensor 36.

According to the embodiment, the operation unit 28 of the input device is made of a transparent material, and the display unit 40 is disposed at the back side of the operation unit 28. Therefore, the correspondence of operation and display is easy to understand, and the input device of easy input operation can be presented. Moreover, since the flat electrode 30 for composing the operation unit 28 can be formed only on one side of the base material 29, so that the input device may be manufactured at low cost. When disposing plural flat electrodes 30 closely, mutual effects are avoided. Since there is no mutual effect, in the input device of the embodiment, plural flat electrodes 30 can be disposed in a free shape and layout on the base material 29.

Figure 4:
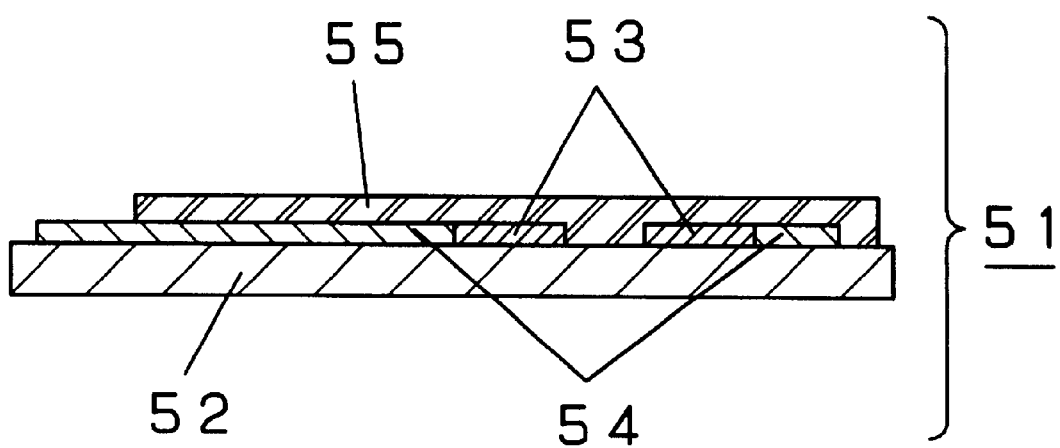
FIG. 4 is a sectional view of operation unit of other constitution in FIG. 2.

Other example is shown in FIG. 4. As shown in the sectional view of an operation unit 51 in FIG. 4, a first insulation layer 55 made of silicon dioxide ($SiO_2$) is disposed so as to cover flat electrodes 53 and wiring lines 54 on the top of a base material 52. As a result, the flat electrodes 53 and wiring lines 54 can be protected from contact with metal and other parts. In this constitution, moreover, the surface of the operation unit 51 is excellent in scratch resistance during handling or use of the operation unit 28 in assembling procedure or the like.

Figure 5:
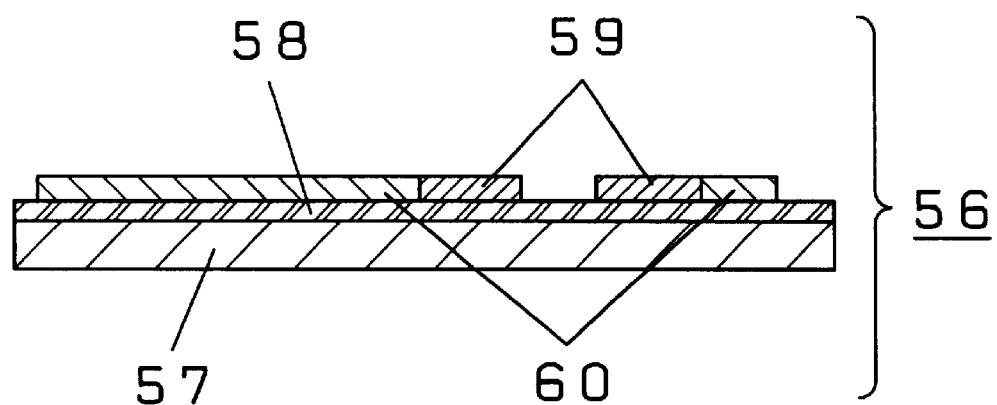
FIG. 5 is a sectional view of operation unit of other constitution in FIG. 2.

As shown in a sectional view of an operation unit 56 in FIG. 5, a second insulation layer 58 made of $SiO_2$ is disposed on the top of a base material 57, and flat electrodes 59 and wiring lines 60 are formed on the top of this second insulation layer 58. As a result, the adhesion of the base material 57 and second insulation layer 58, and of the second insulation layer 58, flat electrodes 59 and wiring lines 60 may be enhanced. Further, this constitution is excellent in durability.

Figure 6:
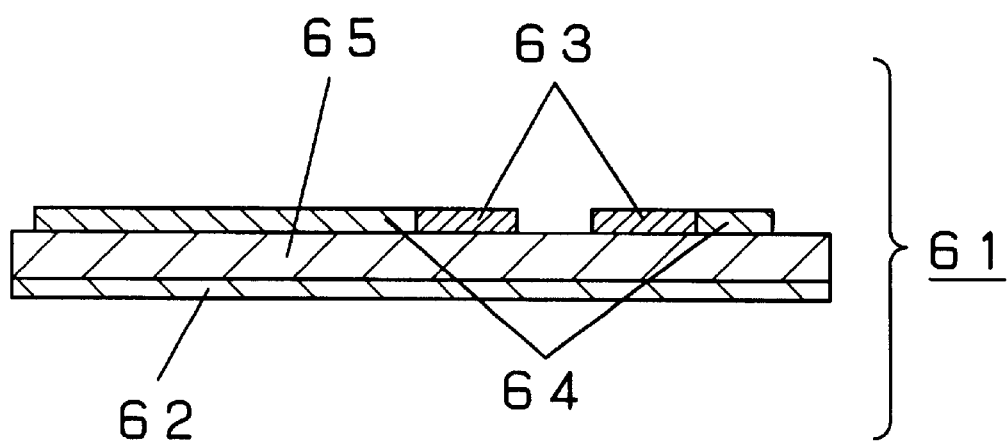
FIG. 6 is a sectional view of operation unit of other constitution in FIG. 2.

Moreover, as shown in a sectional view of an operation unit 61 in FIG. 6, a third insulation layer 62 made of $SiO_2$ is disposed on the facing side of a base material 65 of flat electrodes 63 and wiring lines 64. In this constitution, scratch resistance of the back side of the base material 65 is enhanced in assembling and handling.

The input device of the invention may have either one or two or more of the first insulation layer 55, second insulation layer 58, and third insulation layer 62.

The base materials 52, 57, and 65 may be made of, aside from polycarbonate, polymers such as acrylic resin, methacrylic resin, polyolefin resin, polystyrene resin, polyethylene terephthalate, and polyether sulfone, or inorganics such as glass, alumina, and ceramics. Conductive parts of operation units such as flat electrodes 53, 59, 63, and wiring lines 54, 60, 64 may be made of, aside from ITO, transparent conductive films such as tin oxide ($SnO_2$), zinc oxide (ZnO), gold (Au) thin film and silver (Ag) thin film, or conductive paste cured film such as having silver powder or copper powder dispersed on resin binder. In the first to third insulation layers 55, 58, 62, aside from $SiO_2$, inorganics such as titanium oxide ($TiO_2$) and silicon nitride (SiN), polymers such as acrylic resin, epoxy resin, melamine resin, polyester resin, and urethane resin, and their mixtures may be used. When the thickness of the first to third insulation layers 55, 58, 62 is set in a range of 0.05 to 1000 $\mu$m, the input sensitivity will not be lowered. A polymer film such as polyethylene-terephthalate and polyethylene may be also adhered to the first or third insulation layer 55, 62.

Conductive parts of operation units such as flat electrodes 53, 59, 63, and wiring lines 54, 60, 64 on the transparent base materials 52, 57, 65 are formed of transparent conductive films such as ITO and tin oxide, in a thickness of 150 angstroms(Å) or less. By thus forming, the difference of the flat electrodes 53, 59, 63, and wiring lines 54, 60, 64, from other parts is hardly visible. When the first and third insulation layers 55 and 62 are made of $SiO_2$ with index of refraction of 1.4 in a thickness of 0.1±0.05 $\mu$m, and when the base materials 52, 57, 65 are made of polycarbonate with index of refraction of 1.6 in a thickness of 2 mm, the light reflection factor of the face and back sides can be decreased by the light interference effect from 4% to 1.5% as compared with the case not forming the first and third insulation layers 55, 62, and the light transmission factor is enhanced from 88% to 93%. In this constitution, suppressing the external light reflection, an input device having an operation unit of high light transmission factor and excellent visibility is manufactured.

Similar effects are obtained when a material with index of refraction of less than 1.5 is formed in a thickness of 0.1±0.05 $\mu$m on either one of the first and third insulation layer 55 and 62, or the second insulation layer 58.

As the first to third insulation layers 55, 58, 62, as the transparent insulating film material with index of refraction of less than 1.5, aside from $SiO_2$, $MgF_2$ or other fluoroplastics may be used. As the base materials 52, 57, 65 with index of refraction of 1.5 or more, aside from polycarbonate, acrylic resin, methacrylic resin, soda lime glass, and other materials may be used.

Embodiment 2

Figure 7:
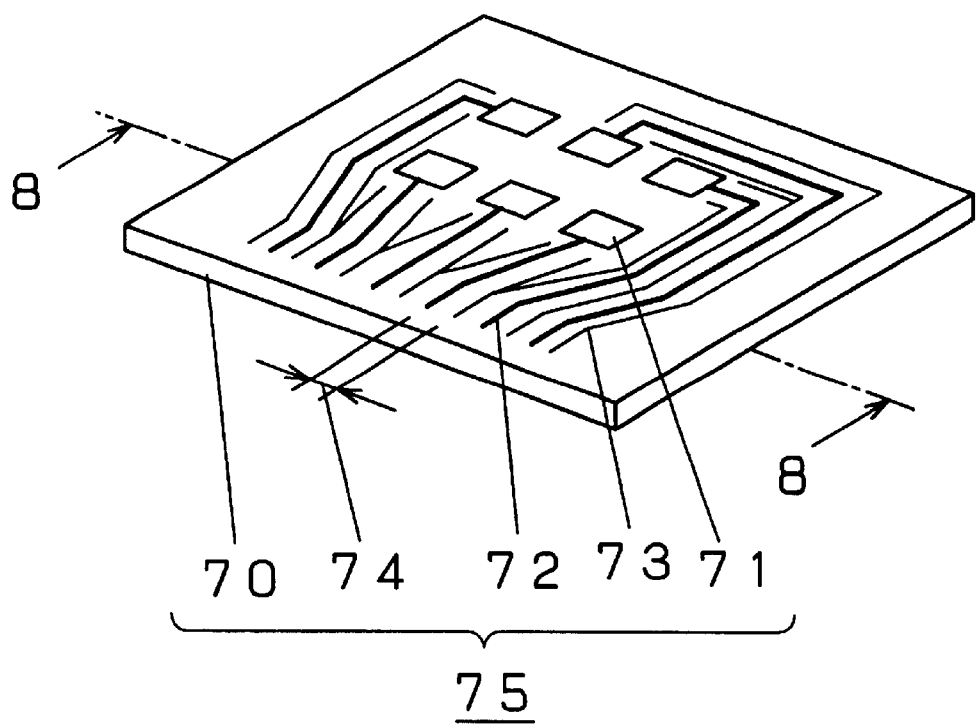
FIG. 7 is a perspective view of operation unit of an input device in a second exemplary embodiment of the invention.
Figure 8:
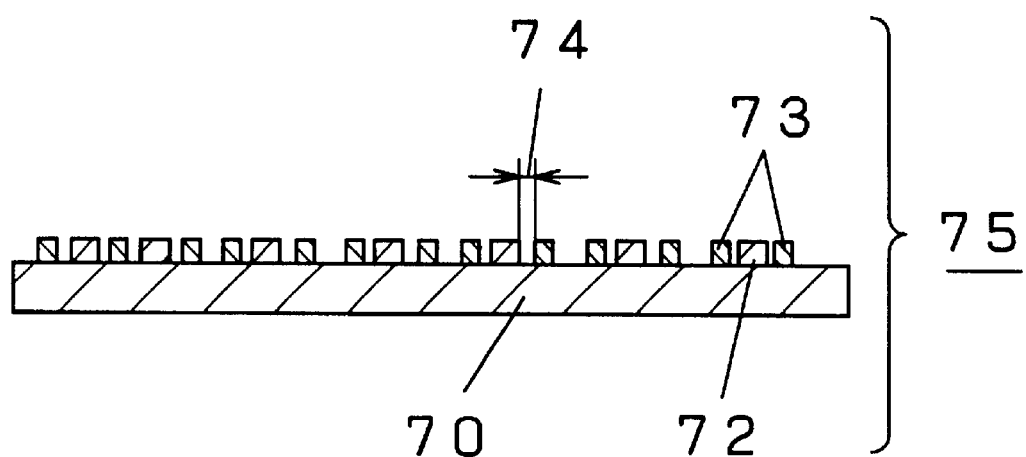
FIG. 8 is a sectional view along line 8—8 in FIG. 7.

FIG. 7 is a perspective view of an operation unit of an input device according to embodiment 2 of the invention, and FIG. 8 is a sectional view along line 8—8 in FIG. 7.

The operation unit of the input device of embodiment 2 of the invention comprises:

a base material 70, a plurality of flat electrodes 71, and a plurality of fine wiring lines 72.

One end of each wiring line 72 is connected to each flat electrode 71.

As compared with the operation unit of the input device of the first embodiment, small insulation gaps 74 are formed between adjacent plural wiring lines 72, and wirings 73 for prevention of malfunction are additionally formed at both sides of the wiring lines 72.

The wirings 73 for prevention of malfunction are made of same materials as the flat electrodes 71 and wiring lines 72. Like the wiring lines 72, the wirings 73 for prevention of malfunction are connected to other parts than the connection parts of the wiring lines 72 of the ground current detection circuit (not shown) by using connector (not shown) or other means.

In the input device having thus constituted operation unit 75, when the user touches a desired flat electrode 71 by finger, the operation is same as in embodiment 1. However, when touching the wiring line 72 by mistake, the wiring 73 for prevention of malfunction disposed at the small insulation gap 74 is also touched. As a result, ground currents of two systems through the wiring line 72 and wiring 73 for prevention of malfunction are fed into the ground current detection circuit. Herein, suppose the ground current when touching the flat electrode 71 to be 171, the ground current when touching the wiring line 72 to be 172, and the ground current when touching the wiring 73 for prevention of malfunction to be 173.

The ground current detection circuit or control circuit (not shown) is designed to detect the ground current 172 and ground current 173 or the ground current 172 only so as to distinguish from the ground current 171. By this means, wrong input can be prevented if the wiring line 72 is touched by mistake.

Figure 9:
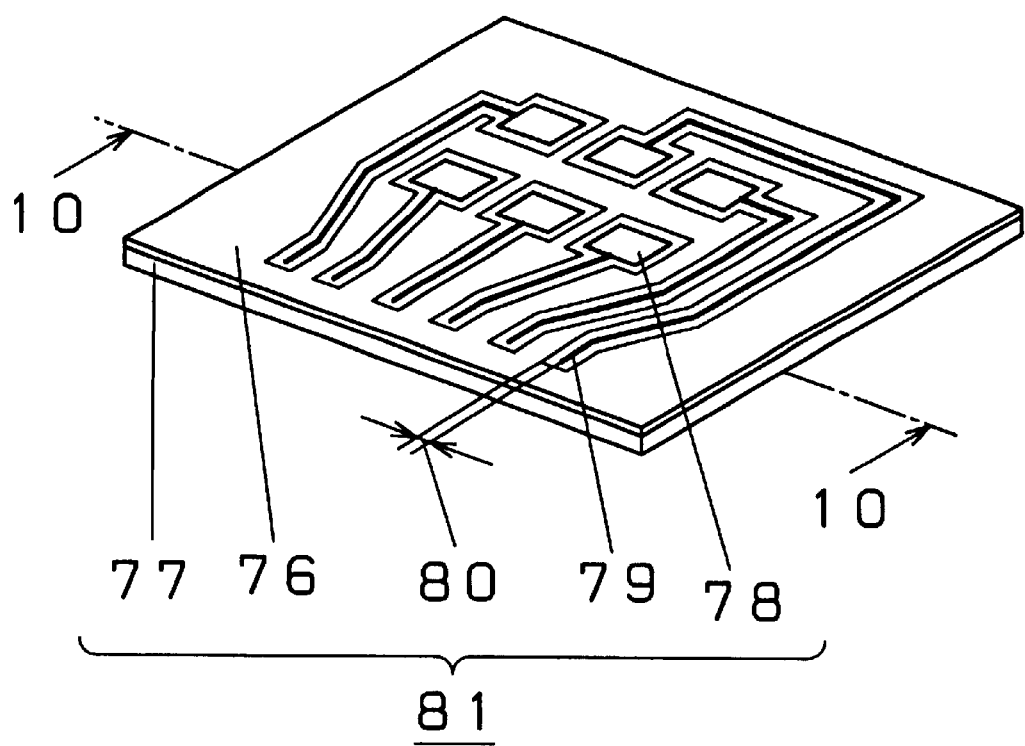
FIG. 9 is a perspective view of operation unit of other constitution in FIG. 7.
Figure 10:
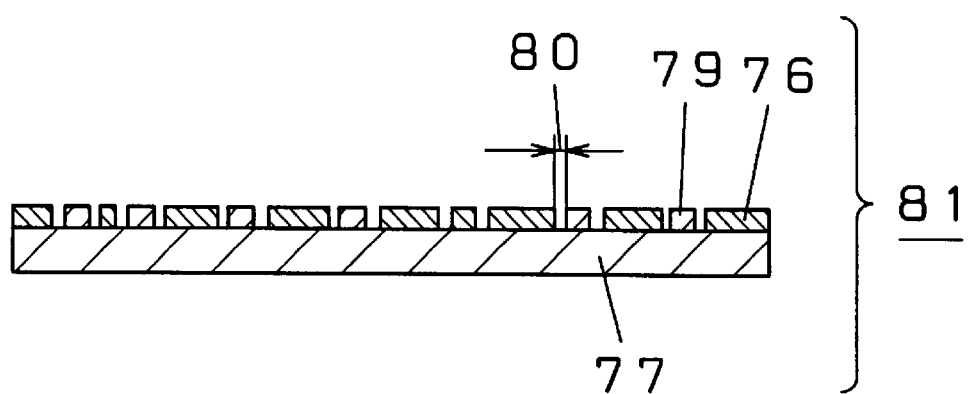
FIG. 10 is a sectional view along line 10—10 in FIG. 9.

FIG. 9 is a perspective view of an operation unit in other constitution of the embodiment and FIG. 10 is a sectional view along line 10—10 in FIG. 9. This embodiment 2 is different from the one shown in FIG. 7 only in the shape of an electrode 76 for prevention of malfunction.

That is, on a base material 77, the electrode 76 for prevention of malfunction disposed across a small insulation gap 80 on the entire circumference of all flat electrodes 78 and wiring lines 79.

In the input device having thus constituted operation unit 81, since the wiring lines 79 are fine linear and insulation gap 80 is small, the same means as shown in FIG. 7 may be carried out. By the same means as in FIG. 7, wrong input can be prevented if touching the wiring line 79 by mistake. Moreover, since the electrode 76 for prevention of malfunction is disposed on the entire circumference of the flat electrodes 78 and wiring lines 79, it is also effective to prevent wrong input by electric noise induced in the flat electrodes 78 and wiring lines 79 by absorbing electric noise from outside.

Figure 11:
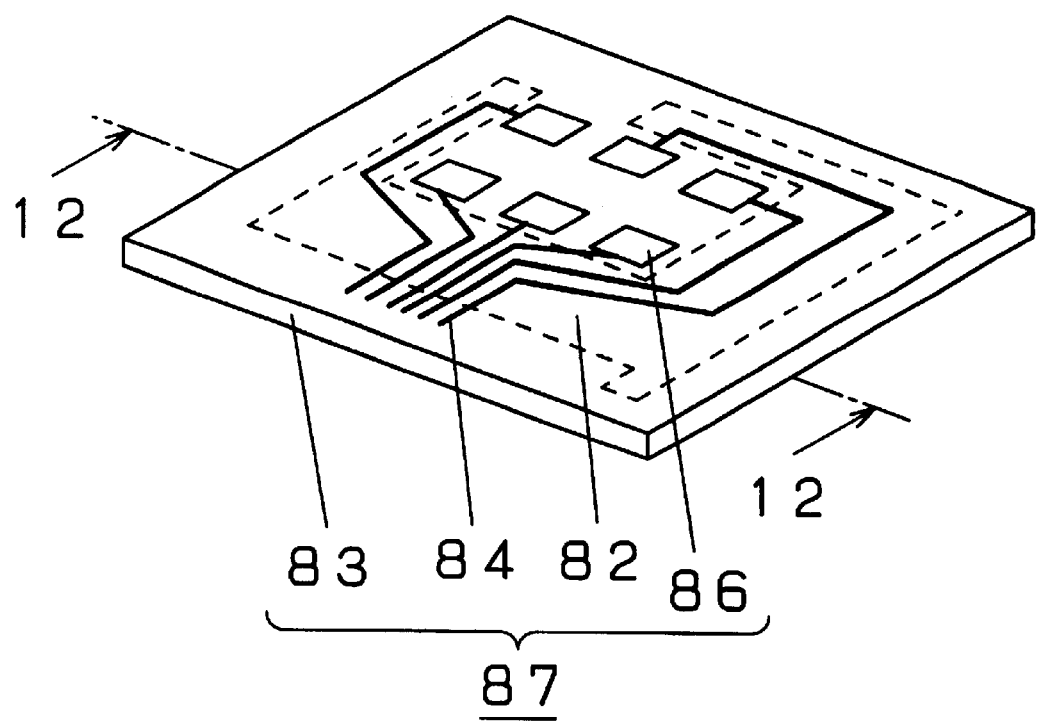
FIG. 11 is a perspective view of operation unit of other constitution in FIG. 9.
Figure 12:
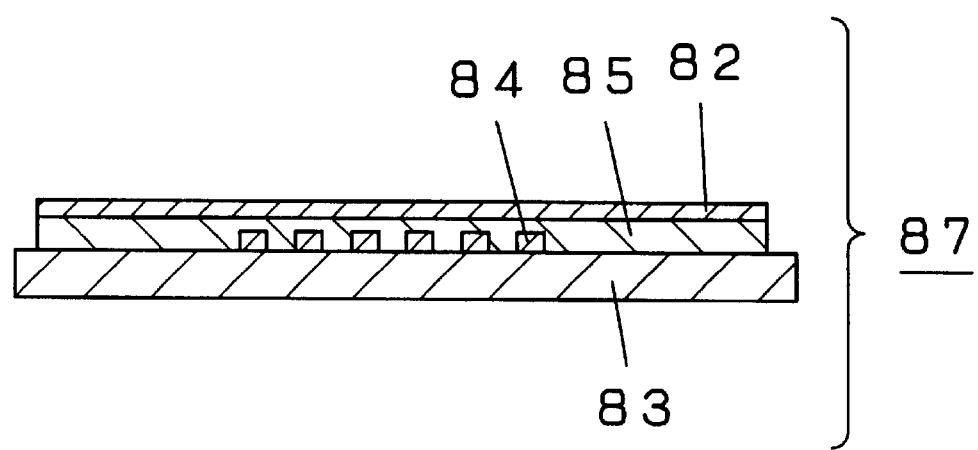
FIG. 12 is a sectional view along line 12—12 in FIG. 11.

FIG. 11 is a perspective view of an operation unit in other constitution of the embodiment and FIG. 12 is a sectional view along line 12—12 in FIG. 11. FIG. 11 is different from FIG. 7 and FIG. 9 in the shape and layout of an electrode 82 for prevention of malfunction.

That is, a fourth insulation layer 85 made of $SiO_2$ is formed to cover the top of wiring lines 84 disposed on the top of a base material 83, and an electrode 82 for prevention of malfunction made of same material as flat electrodes 86 and wiring lines 84 is disposed on its top.

In the input device having thus constituted operation unit 87, if touching the top of the wiring lines 84 by mistake, the electrode 82 for prevention of malfunction is touched, and wrong input can be prevented. In this constitution, it is not necessary to dispose the electrode for prevention of malfunction by opening an insulation gap between plural wiring lines 84, so that the wiring lines 84 can be disposed at narrow pitches in the portion of the wiring lines 84 drawn out from the base material 83. Therefore, only a small connector (not shown) may be used for connection.

Figure 13:
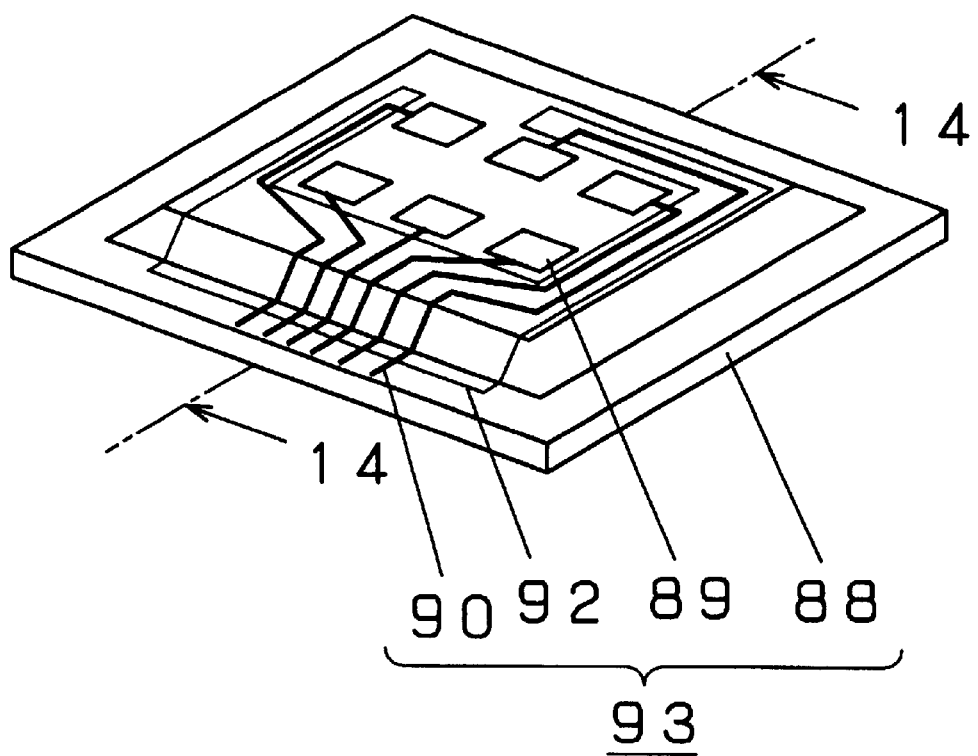
FIG. 13 is a perspective view of operation unit of other constitution in FIG. 11.
Figure 14:
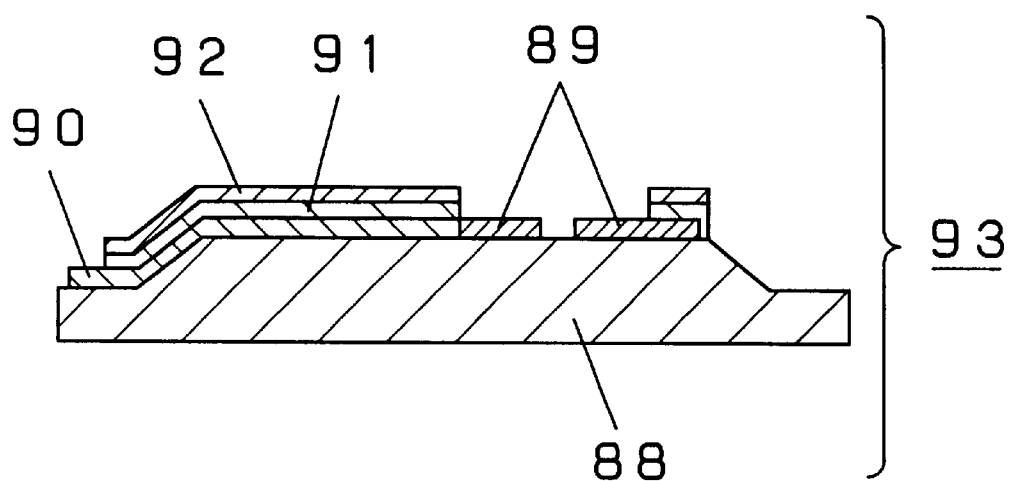
FIG. 14 is a sectional view along line 14—14 in FIG. 13.

Further, FIG. 13 is a perspective view of a constitution in which the shape of the base material of the operation unit is different from that in FIG. 11, and FIG. 14 is its sectional view along line 14—14 in FIG. 13. A base material 88 is formed thick so that its central part may project. Flat electrodes 89, wiring lines 90, first insulation layer 91, and electrode 92 for prevention of malfunction are formed on the top of the base material 88, and an operation unit 93 is constituted. Further, the wiring lines 90 are drawn out from the thick central part of the base material 88 to the thin end portion of the base material 88, and connected to connector (not shown) or the like.

By using the base material 88 of such shape, the operation unit 93 comes to have a fashionable sense in design. Also by forming the base material in a solid shape or curved shape having raised and dented parts different from the shape described above, the flat electrodes, wiring lines, and electrode for prevention of malfunction may be disposed in a free shape. This constitution increases the degree of freedom of designing of the operation unit of the input device.

Embodiment 3

Figure 15:
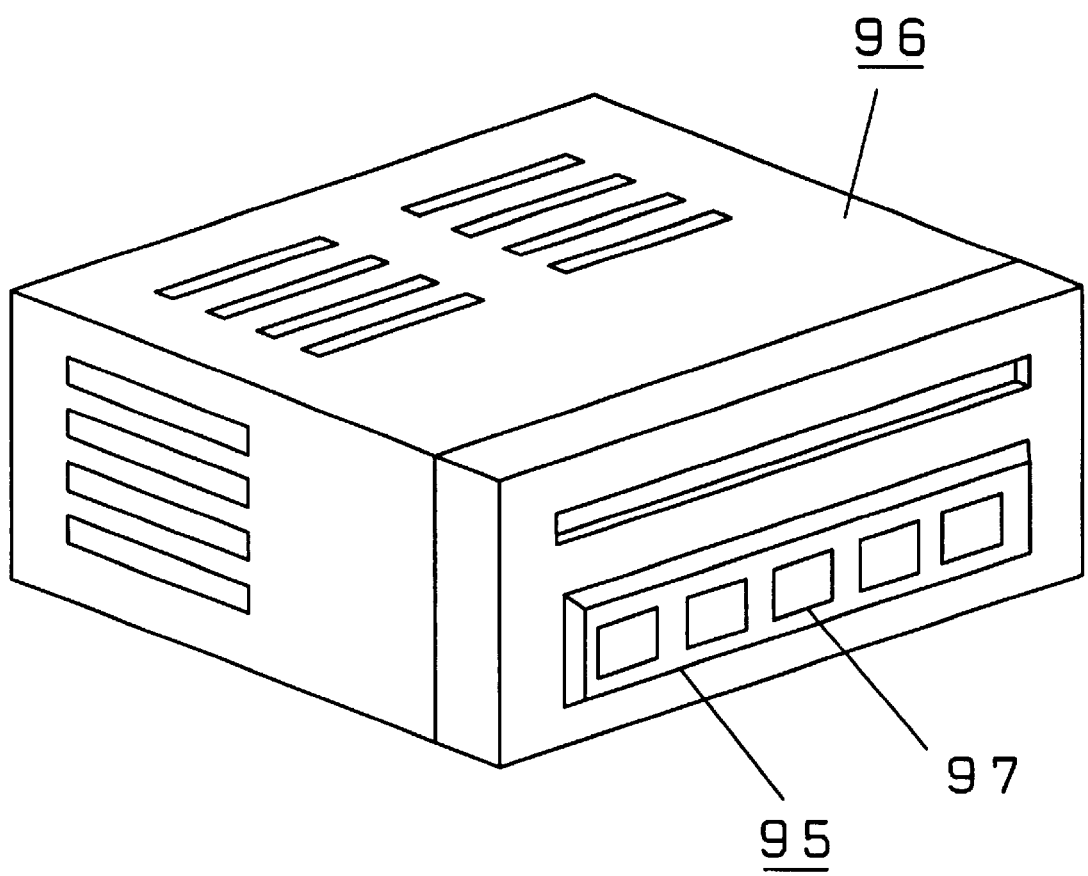
FIG. 15 is a perspective view of an electronic appliance in embodiment 3 of the invention.
Figure 16:
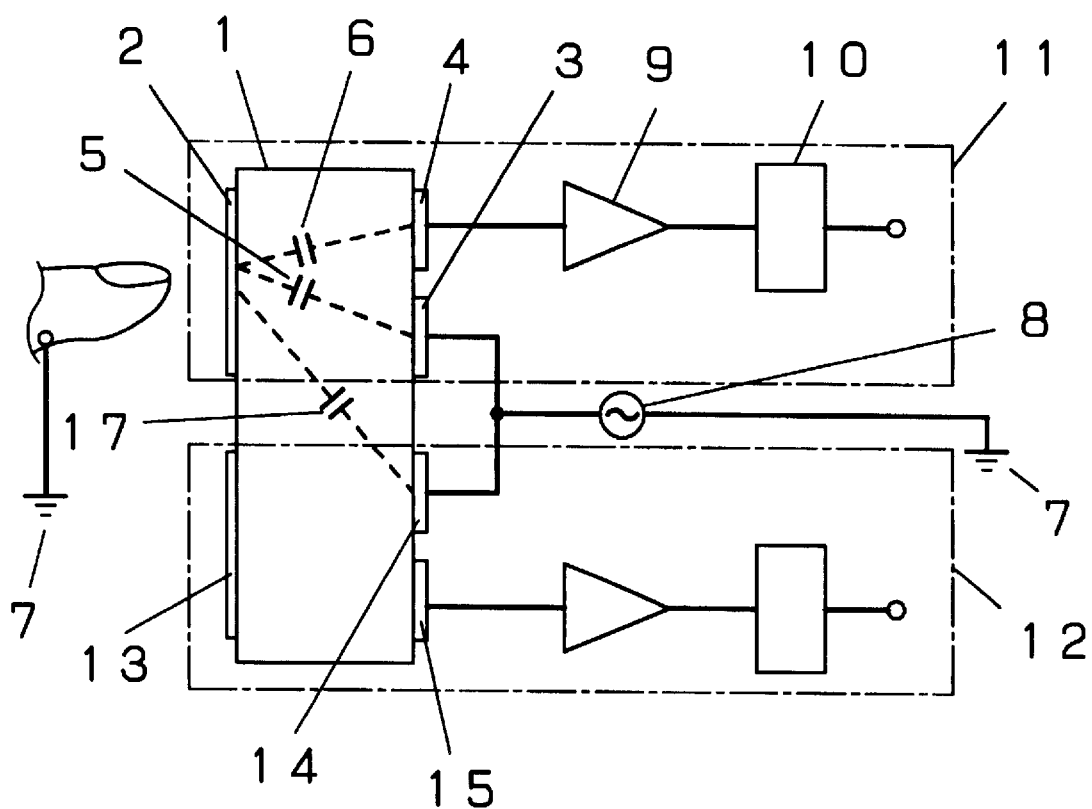
FIG. 16 is a structural diagram of a conventional capacitance type touch switch.
Figure 17:
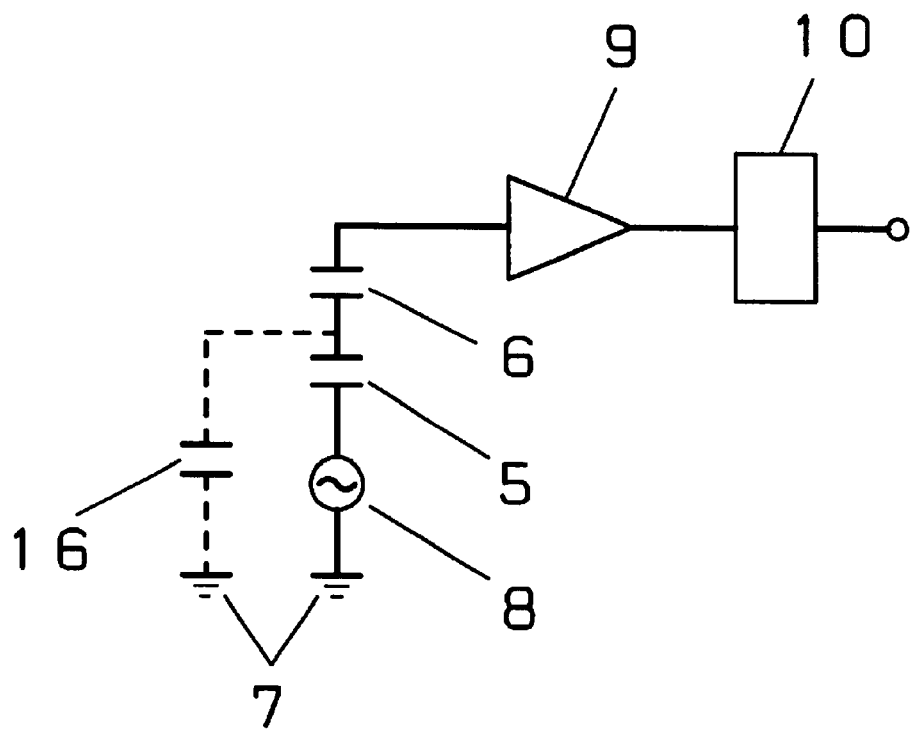
FIG. 17 is a circuit conceptual diagram of the conventional capacitance type touch switch.

FIG. 15 is a perspective view of an electronic appliance according to embodiment 3 of the invention. FIG. 15 shows an example of mounting an operation unit 95 of the input device on the front face of the device main body 96. A plurality of flat electrodes 97 are disposed on the entire surface of the operation unit 95, and the materials for composing the entire operation unit 95 are made of transparent materials.

By touching a desired one of the plurality of flat electrodes 97 by finger, the device main body 96 operates the corresponding functions, that is, power on/off switching, sound volume increase or decrease, selection of source, play or stop of selected source, and input operation of characters.

The inside of each flat electrode 97 is designed to display corresponding to each function.

In this embodiment, the device main body 96 can be controlled, if desired, by only touching lightly by finger according to the inside display of the flat electrode 97, and the electronic appliance having the input device with a fashionable sense can be presented.

Thus, according to the invention, there is no mutual effect if a plurality of flat electrodes are disposed closely, an input device having a plurality of flat electrodes disposed on a base material in a free shape and layout is obtained, it can be manufactured at low cost because flat electrodes are formed on one side of the base material only, moreover, the operation unit is made of a transparent material, and the display unit is disposed on the back side, the correspondence between operation and display is easy to understand, so that input operation is easy, and the electronic appliance can be controlled, if desired, by only touching lightly by finger.

Therefore, the input device of fashionable sense, and the electronic appliance using it can be presented.

What is claimed is:

1. An input device for use with a power source comprising:

a power transformer connected to said power source, a ground current detection circuit coupled to a secondary side circuit of said power transformer, said ground current detection circuit for issuing a signal when magnitude of ground current received thereby is above a threshold level, impedence elements connected between said ground current detection circuit and the primary side circuit of said power transformer, an operation unit having one or more electrodes disposed at least on the top of a base material made of insulating material connected to said ground current detection circuit electrically, and for transmitting ground current having magnitude above said threshold to said ground current detection circuit when, as a result of touching said input device, ground current above said threshold level flows therethrough.

2. An input device of claim 1, wherein the control circuit has one end connected to the ground current detection circuit, and other end connected to a display unit showing the display corresponding to the one or more electrodes of said operation unit.

3. An input device of claim 1, wherein the operation unit has fine wiring lines for connecting between the one or more electrodes and the ground current detection circuit on the top of the base material, and wirings for prevention of malfunction connected to said ground current detection circuit across a small insulation gap against both sides of the wiring lines.

4. An input device of claim 1, wherein the operation unit has fine wiring lines for connecting between the one or more electrodes and the ground current detection circuit on the top of the base material, and an electrode for prevention of malfunction disposed by forming a small insulation gap on the outer circumference of said flat electrodes and wiring lives and connecting to said ground current detection circuit around this insulation gap.

5. An input device of claim 1, wherein the operation unit has a first insulation layer of a thin film disposed so as to cover at least the one or more electrodes on the top of the base material.

6. An input device of claim 5, wherein the first insulation layer is formed of a transparent insulation film of 0.05 to 1000 µm in thickness.

7. An input device of claim 5, wherein the thickness of the first insulation layer is 0.1±0.05 µm, its index of refraction is less than 1.5, and the index of refraction of the base material is 1.5 or more.

8. An input device of claim 1, wherein the operation unit has a second insulation layer at least between the one or more electrodes and base material.

9. An input device of claim 8, wherein the thickness of the second insulation layer is 0.1±0.05 µm, its index of refraction is less than 1.5, and the index of refraction of the base material is 1.5 or more.

10. An input device of claim 1, wherein the operation unit has a third insulation layer disposed at least at a position facing the one or more electrodes on the top of the base material.

11. An input device of claim 10, wherein the third insulation layer is formed of a transparent insulation film of 0.05 to 1000 µm in thickness.

12. An input device of claim 10, wherein the thickness of the third insulation layer is 0.1±0.05 µm, its index of refraction is less than 1.5, and the index of refraction of the base material is 1.5 or more.

13. An input device of claim 1, wherein the operation unit has a wiring line provided for connecting electrically between the one or more electrodes and the ground current detection circuit on the top of the base material, a fourth insulation layer disposed to cover at least this wiring line, and an electrode for prevention of malfunction electrically connected to said ground current detection circuit on the top of this fourth insulation layer.

14. An input device of claim 1, wherein the operation unit is made of light transmitting material, and has a display unit disposed at a position facing the one or more electrodes of this operation unit.

15. An input device of claim 14, wherein the conductive parts of the operation unit are made of transparent conductive film of 150 angstroms or less in thickness.

16. An input device of claim 1, wherein the operation unit has a solid form having an undulated surface of the base material containing the one or more electrodes.

17. An input device of claim 1, wherein the impedance element is at least resistor, capacitor, or reactor.

18. An input device of claim 1, wherein a high resistor is connected in series between the one or more electrodes and the ground current detection circuit.

19. An input device of claim 18, wherein a constant voltage element is connected between the junction of the high resistor and ground current detection circuit and the ground of the secondary side circuit of the power transformer.

20. An input device of claim 1, wherein a low pass filter is connected in series between the one or more electrodes and the ground current detection circuit.

21. An input device of claim 1, wherein the ground current detection circuit includes at least an integrating circuit.

22. An input device of claim 1, wherein the ground current detection circuit includes at least an integrating circuit and a discrimination circuit, and this discrimination circuit is connected to the control circuit.

23. An input device of claim 1, wherein the ground current detection circuit includes at least a retriggerable multivibrator.

24. An output device of claim 1, wherein aid input device is included in a electronic appliance which further comprises a device main body, said input device, disposed at least on one side of this device main body, wherein said device main body is operated by manipulating this input device.

* * * * *

UNITED STATES PATENT AND TRADEMARK OFFICE
CERTIFICATE OF CORRECTION

PATENT NO.     : 6,504,269 B1
DATED          : January 7, 2003
INVENTOR(S)    : Miyajima et al.

It is certified that error appears in the above-identified patent and that said Letters Patent is hereby corrected as shown below:

Column 9,
Line 1, "lives" should read -- lines --.

Signed and Sealed this

Tenth Day of June, 2003

JAMES E. ROGAN
*Director of the United States Patent and Trademark Office*